(12) United States Patent
Kuenemund

(10) Patent No.: US 9,548,737 B1
(45) Date of Patent: Jan. 17, 2017

(54) METHOD FOR MANUFACTURING A DIGITAL CIRCUIT AND DIGITAL CIRCUIT

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/801,868

(22) Filed: Jul. 17, 2015

(51) Int. Cl.
*G06F 21/72* (2013.01)
*H04L 9/06* (2006.01)
*H03K 19/003* (2006.01)
*H01L 21/8234* (2006.01)

(52) U.S. Cl.
CPC . *H03K 19/00315* (2013.01); *H01L 21/823475* (2013.01)

(58) Field of Classification Search
CPC ..... G06F 21/72; G04L 9/06; H03K 19/00315; H01L 21/823475
USPC ......................... 326/8, 104, 112, 119; 380/44
See application file for complete search history.

(56) References Cited

U.S. PATENT DOCUMENTS

| | | | |
|---|---|---|---|
| 7,916,517 B2 | 3/2011 | Kuenemund | |
| 8,111,089 B2 | 2/2012 | Cocchi et al. | |
| 8,434,046 B2 | 4/2013 | Marinet | |
| 2013/0320491 A1* | 12/2013 | Thacker, III | ........ H01L 27/0203 257/531 |
| 2014/0327469 A1 | 11/2014 | Pfeiffer et al. | |
| 2015/0071434 A1 | 3/2015 | Thacker, III et al. | |
| 2015/0294943 A1 | 10/2015 | Kuenemund et al. | |
| 2015/0294944 A1 | 10/2015 | Kuenemund et al. | |
| 2015/0303927 A1 | 10/2015 | Kuenemund et al. | |
| 2015/0311202 A1 | 10/2015 | Kuenemund | |
| 2015/0381351 A1 | 12/2015 | Kuenemund et al. | |

OTHER PUBLICATIONS

Rajendran et al., "Security Analysis of Integrated Circuit Camouflaging", CCS'13, Nov. 4-8, 2013, Berlin, Germany, 12 pages.

* cited by examiner

*Primary Examiner* — Daniel D Chang

(57) ABSTRACT

A method for manufacturing a digital circuit is described including forming a plurality of field effect transistor pairs, connecting the field effect transistors of the field effect transistor pairs such that in response to a first transition from a first state of two nodes of the digital circuit and in response to a second transition from a second state of the nodes of the digital circuit the nodes each have an undefined logic state when, for each field effect transistor pair, the threshold voltages of the field effect transistors of the field effect transistor pair are equal and setting the threshold voltages of the field effect transistors of the field effect transistor pairs such that the nodes each have a predetermined defined logic state in response to the first transition and in response to the second transition.

20 Claims, 12 Drawing Sheets

METHOD FOR MANUFACTURING A DIGITAL CIRCUIT AND DIGITAL CIRCUIT

TECHNICAL FIELD

The present disclosure relates to a method for manufacturing a digital circuit and a digital circuit.

BACKGROUND

Reverse Engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned circuit, and illegally sell and reveal the design.

Therefore concepts and techniques that thwart reverse engineering of integrated circuits are desirable.

SUMMARY

A method for manufacturing a digital circuit is provided including forming a plurality of field effect transistor pairs, connecting the field effect transistors of the field effect transistor pairs such that in response to a first transition from a first state of two nodes of the digital circuit and in response to a second transition from a second state of the nodes of the digital circuit the nodes each have an undefined logic state when, for each field effect transistor pair, the threshold voltages of the field effect transistors of the field effect transistor pair are equal and setting the threshold voltages of the field effect transistors of the field effect transistor pairs such that the nodes each have a predetermined defined logic state in response to the first transition and in response to the second transition.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

Figure 1:
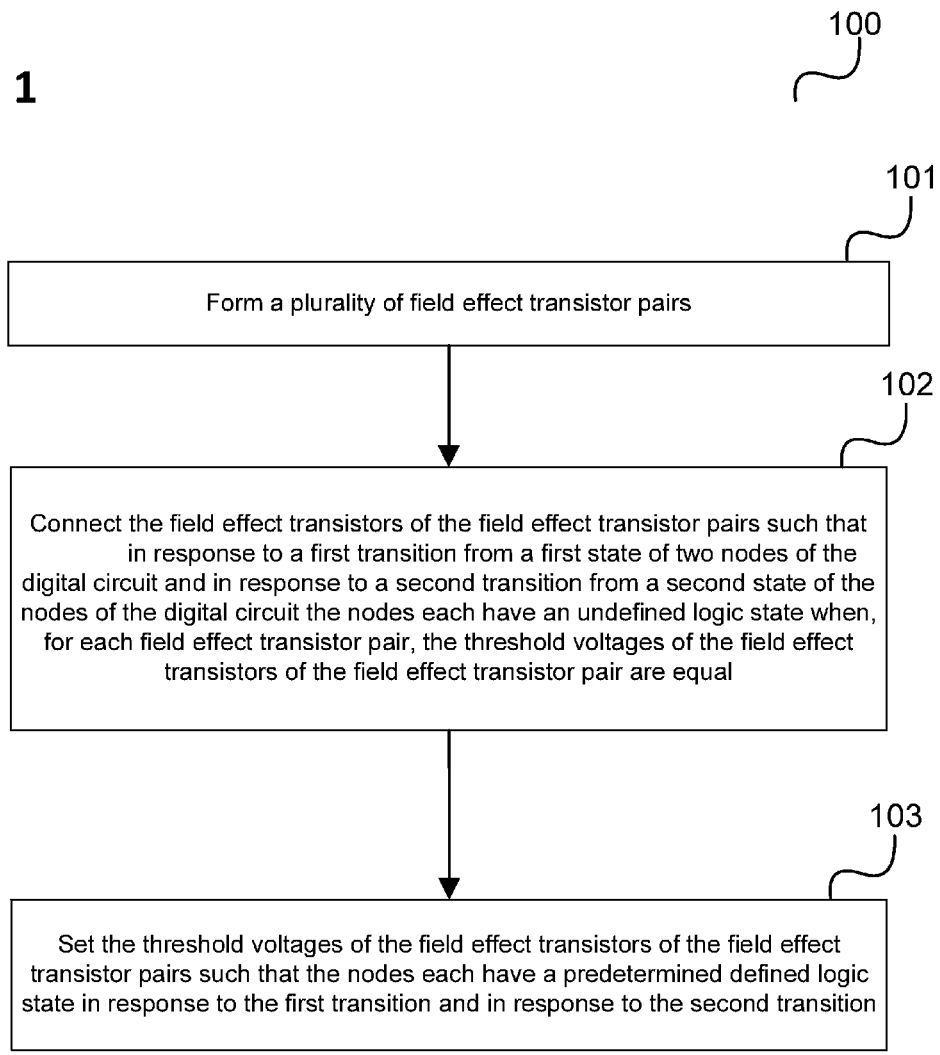
FIG. 1 shows a flow diagram illustrating a method for manufacturing a digital circuit.

The following detailed description refers to the accompanying drawings that show, by way of illustration, specific details and aspects of this disclosure in which the invention may be practiced. Other aspects may be utilized and structural, logical and electrical changes may be made without departing from the scope of the invention. The various aspects of this disclosure are not necessarily mutually exclusive, as some aspects of this disclosure can be combined with one or more other aspects of this disclosure to form new aspects.

Reverse engineering (RE) can be hindered by deploying camouflage circuits. However, these typically require process technology extensions like doping profile modifications, faked contacts or vias and/or entail significantly increased area and energy consumption. Thus, these measures are often too expensive for mass products.

Indistinguishable yet Complementary Bit Cells, ICBC-X (existing in two flavors or types, namely ICBC-1 and ICBC-0) representing gates that respond to an appropriate challenge by outputting a robust logical one or a robust logical zero, respectively, cannot be easily distinguished by means of Reverse Engineering (RE) and other analysis methods, i.e. attacks to Chip Card Controllers and Security ICs.

The ICBC-X's physical design is (sufficiently) symmetric in terms of its layout, i.e. its active regions, poly-silicon gates, contacts, metal connectivity etc. However, the ICBC-X's nMOS and pMOS components (i.e. nMOS and pMOS field effect transistors) feature appropriately different threshold voltages (Vth) resulting in the robust transfer characteristics of the ICBC-X when challenged with an input pattern that would otherwise cause the circuit to enter a metastable state.

Since process options "regular Vth" and "high Vth" can be used to realize an ICBC-X, no process change is required, provided a mixed-Vth scenario for the Security IC under consideration can be assumed. Further, ICBC-1 and ICBC-0 are static CMOS gates that can be implemented as elements of Standard Cell Libraries.

Application examples include "dynamical" TIE-1 and TIE-0 cells, i.e. TIE cells that can be switched between logically valid and invalid states, representing e.g. bits of a secret key or other pieces of confidential information.

Moreover, ICBC-X instances can be combined with standard logic gates to achieve RE-resistant data paths and ICBC-Xs can be concatenated to realize dynamical TIE tree structures. Session key generation as well as address-dependent memory encryption configuration are also possible.

In addition to that, after roll-out, i.e. after the ICBC-X's initial (e.g. random) configuration, the selected configuration can then be stored in a NVM (non-volatile memory), e.g. of a chip (e.g. a chip card module) including the ICBC-X, for subsequent use in the field. This may even allow for robust and RE-resistant chip-individual pieces of information.

Since a multitude of ICBC-X instances can be distributed irregularly across an IC's entire Semi-Custom portion and because these instances can be accessed in irregular, even random, temporal order, the ICBC-X concept tremendously increases the difficulty, risk and effort for all relevant Security IC attack scenarios like Reverse Engineering, Photon Emission, Laser Voltage Probing, etc.

The basic ICBC-X concept can be seen to rest upon resolving conventionally metastable states or metastable state transitions of (bistable) feedback circuitry by deploying (MOS) transistors (in general switches) with different threshold voltages (in general state transition characteristics) in order to achieve robust ICBC-X state transitions, whereupon the nature of any given ICBC-X instance (X=1 or 0?) remains concealed for an attacker employing relevant Security IC attack scenarios like Reverse Engineering, Photon Emission, Laser Voltage Probing, etc.

ICBC-X circuits as described above exhibit bistable feedback circuitry with
one precharge state (ICBC-X outputs (Z, Y) either at (1, 1) or at (0, 0)) and
one "forbidden transition" of the ICBC-X's outputs:
either (Z, Y)=(1, 1)→(X, not(X)) or (Z, Y)=(0, 0)→(X, not(X)),
depending on the respective ICBC-X circuit design.

In contrast with that, according to various embodiments, ICBC-X circuitry is provided that exhibit both bistable and multiple-stable feedback circuitry with
(at least) two different precharge state (outputs (Z, Y) at (1, 1) and at (0, 0), depending on the respective control input signal states) and
(at least) two different "forbidden transitions" of the ICBC-X's outputs:
(Z, Y)=(1, 1)→(X1, not(X1)) or (Z, Y)=(0, 0)→(X0, not (X0),
depending on the respective control input signal transitions, where the Boolean secrets X1 and X0 may be equal (X1=X0) or complementary (X1=not(X0)), depending on the respective threshold voltage configurations of the ICBC-X's field effect transistors (FETs), e.g. nMOS (n channel metal oxide semiconductor) and pMOS (p channel MOS) FETs.

Since X1 and X0 may be chosen independently, this results in four different ICBC-X incarnations featuring the same physical layout, but differing in their (e.g. CMOS) threshold voltage configurations, and can thus be seen to representing four "magic hoods" for Boolean Secrets. Moreover, the independency of X1 and X0 corresponds to a path-dependency of the Boolean Secrets, i.e. the secret (X1 or X0) does not only depend on the input control signal state but also on the way (i.e. on the transition) this state has been arrived at.

According to one embodiment, a method for manufacturing a circuit is described which efficiently allows increasing the necessary effort for a successful reverse engineering of a circuit, e.g. on a chip, by for example providing ICBC-X circuits with multiple precharge states and multiple "forbidden" transitions.

FIG. 1 shows a flow diagram 100.

The flow diagram 100 illustrates a method for manufacturing a digital circuit.

In 101, a plurality of field effect transistor pairs are formed.

In 102, the field effect transistors of the field effect transistor pairs are connected such that in response to a first transition from a first state of two nodes of the digital circuit and in response to a second transition from a second state of the nodes of the digital circuit the nodes each have an undefined logic state when, for each field effect transistor pair, the threshold voltages of the field effect transistors of the field effect transistor pair are equal.

In 103, the threshold voltages of the field effect transistors of the field effect transistor pairs are set such that the nodes each have a predetermined defined logic state in response to the first transition and in response to the second transition.

In other words, according to one embodiment, metastable states of a circuit caused by forbidden transitions are shifted to predefined stable states by setting the threshold voltages of the transistors (and, thus the relation of the threshold voltages of the transistors) of the circuit accordingly. The threshold voltage of a field effect transistor may for example be set by a certain doping of a region (e.g. a channel region) of the field effect transistor. For example, for each field effect transistor pair, the two field effect transistors of the pair may be differently doped.

It further be noted that in the manufacturing of a digital circuit, the threshold voltages are typically set before the field effect transistors are interconnected. In other words, 103 of the method illustrated in FIG. 1, may be performed before 102, e.g. as a part of 101.

It should further be noted that the threshold voltage of a field effect transistor may be set such that the field effect transistor is always on or always off, e.g. to be higher than or equal to a high supply potential of the digital circuit (VDD) or lower than or equal to a low supply potential of the digital circuit (VSS).

The transitions are for example transitions from different precharge states of the nodes of the circuit. Each transition can be seen as a forbidden transition, meaning a transition which would lead to an undefined logic state when, for each pair, the threshold voltages of the field effect transistors of the pair (in other words the threshold voltages within each pair) were equal. The circuit may be a bistable or multistable circuit wherein the threshold voltages are selected (and set) such that it enters a first state of its (e.g. plurality of) stable states in response to the first transition and a second state of its stable states in response to the second transition, wherein the first state and the second state may be the same states or different states.

One or more digital circuits as manufactured by the method described in FIG. 1 may be included in the chip to prevent reverse engineering of the chip, e.g. a chip card module. According to one embodiment, the one or more digital circuits may then be operated by supplying inputs causing the first transition or the second transition or both, i.e. operated such that the nodes of the digital circuit would each have an undefined logic state when, for each field effect transistor pair, the threshold voltages of the field effect transistors of the field effect transistor pair were equal. Since the threshold voltages are set such that the nodes have, instead, a predetermined defined logic state in response to the input, an output of the digital circuit based on the logic state of the nodes may be further processed by another component. This output may be regarded as a secret since it is based on the logic state of the nodes which depends on the relation of the threshold voltages of the field effect transistors which cannot be easily determined by reverse engineering.

Figure 2:
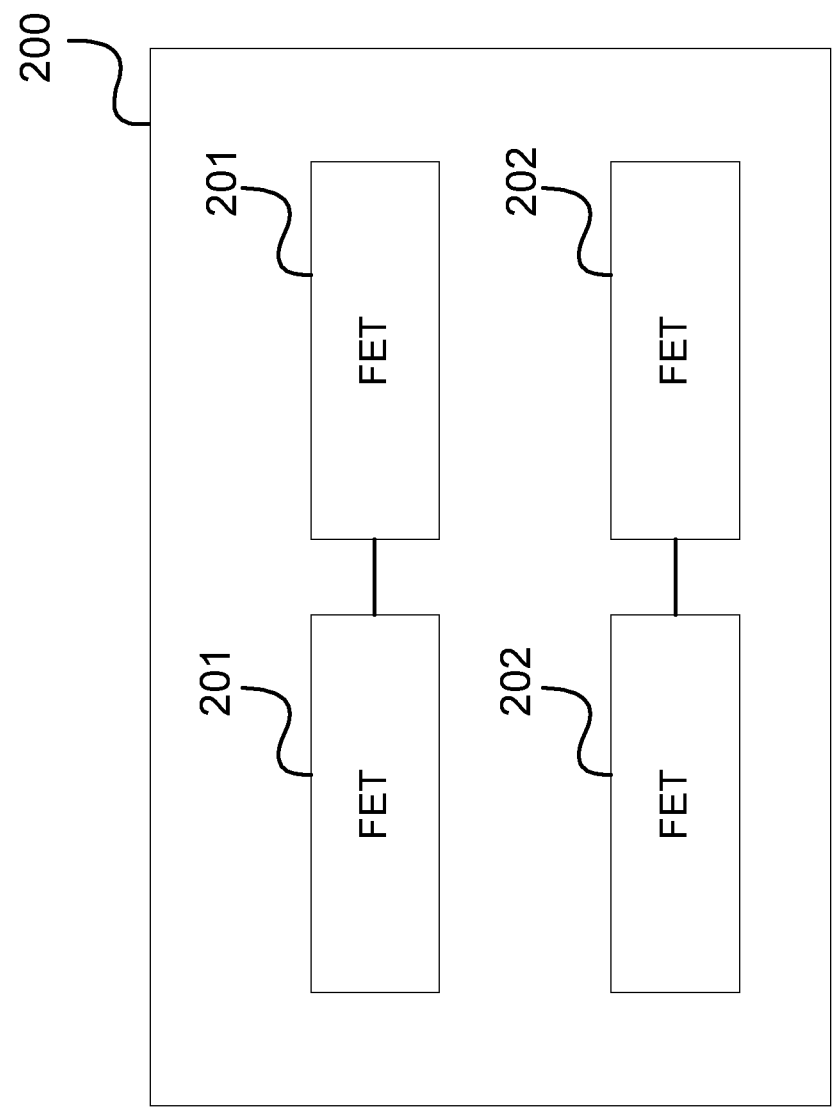
FIG. 2 shows a digital circuit.

An example of a circuit manufactured according to the method illustrated in FIG. 1 is illustrated in FIG. 2.

FIG. 2 shows a digital circuit 200.

The digital circuit 200 includes (two or more) field effect transistor pairs 201, 202 including field effect transistors connected such that in response to a first transition from a first state of two nodes of the digital circuit and in response to a second transition from a second state of the nodes of the digital circuit the nodes each have an undefined logic state when, for each field effect transistor pair, the threshold voltages of the field effect transistors of the field effect transistor pair are equal, wherein, for each field effect transistor pair, the threshold voltages of the field effect transistors of the field effect transistor pair differ by at least 10 mV such that the nodes each have a predetermined defined logic state in response to the first transition and in response to the second transition.

In the following, various embodiments are given.

Embodiment 1 is a method for manufacturing a digital circuit as illustrated in FIG. 1.

Embodiment 2 includes the method of embodiment 1, including forming outputs for signals representing the logic states of the nodes.

Embodiment 3 includes the method according to embodiment 2, including forming a further circuit component and a connection for supplying the signal to the further circuit component.

Embodiment 4 includes the method according to embodiment 3, wherein the further circuit component is a logic gate.

Embodiment 5 includes the method according to embodiment 3, wherein the further circuit component is a flip-flop.

Embodiment 6 includes the method according to embodiment 1, wherein, for each field effect transistor pair, the two field effect transistors of the field effect transistor pair are both n channel field effect transistors or the two field effect transistors of the field effect transistor pair are both p channel field effect transistors.

Embodiment 7 includes the method according to embodiment 1, wherein the field effect transistors of the field effect transistor pairs are MOSFETs.

Embodiment 8 includes the method according to embodiment 1, including forming one or more pairs of competing paths such that, for each field effect transistor pair, the two field effect transistors are in different competing paths of a pair of competing paths.

Embodiment 9 includes the method according to embodiment 8, including connecting the one or more pairs of competing paths such that the logic states of the nodes depend on the result of the competition between the competing paths of the one or more pairs of competing paths.

Embodiment 10 includes the method of embodiment 8, including connecting the one or more pairs of competing paths and the nodes such that for each pair of competing paths, the competing paths are connected to different ones of the two nodes and the electrical state of the node connected to one of the competing paths is fed back to the other of the competing paths to hinder it in a competition of the competing paths.

Embodiment 11 includes the method of embodiment 1, wherein the plurality of field effect transistor pairs includes one or more pull-up field effect transistor pairs each having a field effect transistor in a first pull-up path and a field effect transistor in a second pull-up path and including connecting the first pull-up path to one of the two nodes and the second pull-up path to the other of the two nodes.

Embodiment 12 includes the method of embodiment 11, including setting, for each pull-up field effect transistor pair, the threshold voltage of the field effect transistor in the first pull-up path to be lower than the threshold voltage of the field effect transistor in the second pull-up path.

Embodiment 13 includes the method of embodiment 1, wherein the plurality of field effect transistor pairs includes one or more pull-down field effect transistor pairs each having a field effect transistor in a first pull-down path and a field effect transistor in a second pull-down path and including connecting the first pull-down path to one of the two nodes and the second pull-down path to the other of the two nodes.

Embodiment 14 includes the method of embodiment 13, including setting, for each pull-down field effect transistor pair, the threshold voltage of the field effect transistor in the first pull-down path to be lower than the threshold voltage of the field effect transistor in the second pull-down path.

Embodiment 15 includes the method of embodiment 1, including connecting the field effect transistors of the field effect transistor pairs to pull-up paths and pull-down paths connected to the two nodes and setting the threshold voltages of the field effect transistors of the pull-up paths independently from the threshold voltages of the field effect transistors of the pull-down paths.

Embodiment 16 includes the method according to embodiment 1, including forming the plurality of field effect transistors in CMOS technology.

Embodiment 17 includes the method according to embodiment 1, wherein, for each of the nodes, the predetermined defined logic state is a logic 0 or a logic 1.

Embodiment 18 includes the method according to embodiment 1, wherein, for each field effect transistor pair, the field effect transistors of the field effect transistor pair are formed to substantially have the same dimensions.

Embodiment 19 includes the method according to embodiment 1, including forming the digital circuit such that the first transition and the second transition occur in response to a predetermined input, including one or more input signals supplied to field effect transistors of the field effect transistor pairs.

Embodiment 20 includes the method of embodiment 1, wherein the first transition is a pulling up of the nodes and the method includes connecting the nodes such that, when one of the nodes has been pulled up, it prevents the other node from being pulled up.

Embodiment 21 includes the method of embodiment 1, wherein the second transition is a pulling down of the nodes and the method includes connecting the nodes such that, when one of the nodes has been pulled down, it prevents the other node from being pulled down.

Embodiment 22 is a digital circuit as illustrated in FIG. 2.

Embodiment 23 includes the digital circuit of embodiment 22, wherein, for each field effect transistor pair, the threshold voltages of the field effect transistors of the field effect transistor pair differ by at least 20 mV, differ by at least 30 mV or differ by at least 50 mV.

It should be noted that embodiments described in context with the method described with reference to FIG. 1 are analogously valid for the digital circuit 200 and vice versa.

In the following, embodiments are described in more detail.

Figure 3:
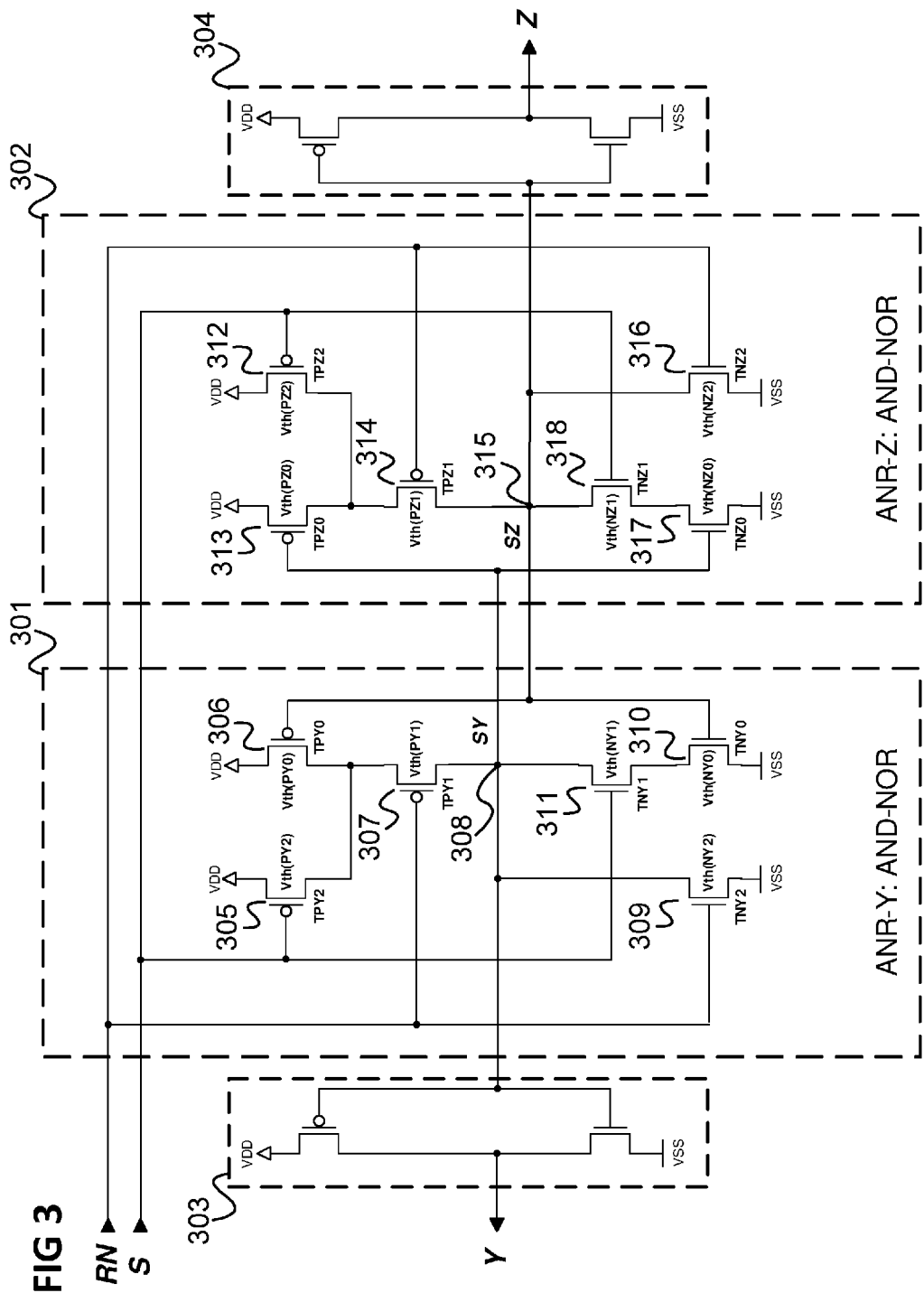
FIG. 3 shows a circuit implementing a "magic hood" cell for path dependent Boolean secrets, in this example an AND-NOR based magic hood cell.

FIG. 3 shows a circuit 300 implementing a "magic hood" cell for path dependent Boolean secrets, in this example an AND-NOR based magic hood cell.

Figure 4:
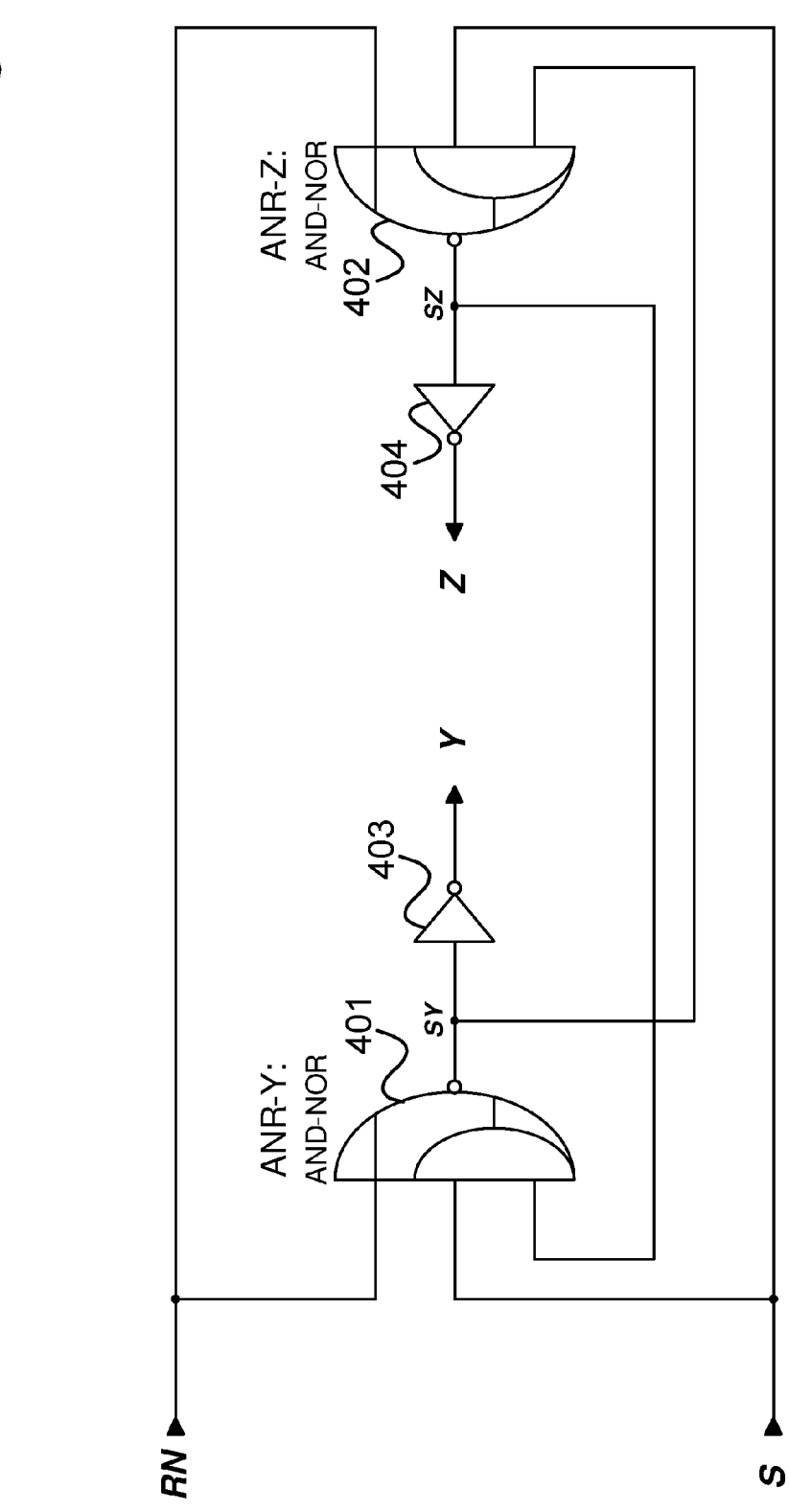
FIG. 4 shows a gate schematic for the circuit of FIG. 3.

FIG. 4 shows a gate schematic for the circuit 300.

The circuit 300 has two control inputs RN and S and two outputs Z and Y. The circuit includes a first AND-NOR 301, 401, a second AND-NOR 302, 402, a first inverter 303, 403 and a second inverter 304, 404.

The first AND-NOR 301 includes a first p channel FET 305 whose source is connected to the high supply potential (VDD) and whose gate is supplied with the signal S. The first AND-NOR 301 further includes a second p channel FET 306 whose source is connected to the high supply potential (VDD). The drains of the first p channel FET 305 and the second p channel FET 306 are connected to the source of a third p channel FET 307 whose gate is supplied with the signal RN and whose drain is connected to a first output node (or feedback node) 308 whose state is referred to by SY.

The first AND-NOR 301 further includes a first n channel FET 309 whose source is connected to the low supply potential (VSS), whose gate is supplied with the signal RN and whose drain is connected to the first output node 308. The first AND-NOR 301 further includes a second n channel FET 310 whose source is connected to the low supply potential (VSS) and whose drain is connected to the source of a third n channel FET 311 whose gate is supplied with the signal S and whose drain is connected to the first output node 308.

The second AND-NOR 302 includes a fourth p channel FET 312 whose source is connected to the high supply potential (VDD) and whose gate is supplied with the signal S. The second AND-NOR 302 further includes a fifth p channel FET 313 whose source is connected to the high supply potential (VDD). The drains of the fourth p channel FET 312 and the fifth p channel FET 313 are connected to the source of a sixth p channel FET 314 whose gate is supplied with the signal RN and whose drain is connected to a second output node (or feedback node) 315 whose state is referred to by SZ.

The second AND-NOR 302 further includes a fourth n channel FET 316 whose source is connected to the low supply potential (VSS), whose gate is supplied with the signal RN and whose drain is connected to the second output node 315. The second AND-NOR 302 further includes a fifth n channel FET 317 whose source is connected to the low supply potential (VSS) and whose drain is connected to the source of a sixth n channel FET 318 whose gate is supplied with the signal S and whose drain is connected to the second output node 315.

The first output node 308 is further connected to the input of the first inverter 303 whose output is the output Y. Further, the first output node 308 is connected to the gates of the fifth p channel FET 313 and the fifth n channel FET 317.

The second output node 315 is further connected to the input of the second inverter 304 whose output is the output Z. Further, the second output node 315 is connected to the gates of the second p channel FET 306 and the second n channel FET 310.

The inverters 303, 304 are for example realized by a p channel FET and an n channel FET connected serially between the high supply potential and the low potential which receive the inverter's 303, 304 input at their gates and wherein the node between them is the output node of the respective inverter 303, 304.

In the following, it is assumed that p channel FETs are implemented by pMOS transistors (also referred to as pMOS devices) and n channel FETs are implemented by nMOS transistors (also referred to as nMOS devices). The circuit 300 as well as the circuits described in the following are for example implemented in CMOS (Complementary Metal Oxide Semiconductor) technology.

For RN=1 the circuit 300 is in its first precharge state:
RN=1=>(SZ, SY)=(0, 0)=>(Z, Y)=(1, 1).

For (RN, S)=(0, 0) the circuit 300 is in its second precharge state:
(RN, S)=(0, 0)=>(SZ, SY)=(1, 1)=>(Z, Y)=(0, 0).

The first forbidden transition is given by
(RN, S)=(1, 1)→(0, 1),
whereby the two competing pull-up paths including the serial connections of the fifth p channel FET 313, denoted by TPZ0 (having threshold voltage Vth(PZ0)), and the sixth p channel FET 314, denoted by TPZ1 (having threshold voltage Vth(PZ1)), for SZ, as well as the second p channel FET 306, denoted by TPY0 (having threshold voltage Vth(PY0)), and the third p channel FET 307, denoted by TPY1 (having threshold voltage Vth(PY1)), for SY, are activated.

Thus, the two different threshold voltage configurations
Vth(PZ1)<Vth(PY1); Vth(PZ0)<Vth(PY0) and
Vth(PZ1)>Vth(PY1); Vth(PZ0)>Vth(PY0)
correspond to the two different values X1=0 and X1=1 for the first forbidden transition
(RN, S)=(1, 1)→(0, 1)=>(Z, Y)=(1, 1)→(X1, not(X1)).

The second forbidden transition is given by
(RN, S)=(0, 0)→(0, 1),
whereby the two competing pull-down paths, including the serial connections of the fifth n channel FET 317, denoted by TNZ0, and the sixth n channel FET 318, denoted by TNZ1, for SZ, as well as the second n channel FET 310, denoted by TNY0, and the third n channel FET 311, denoted by TNY1 for SY, are activated.

Thus, the two different threshold voltage configurations
Vth(NZ1)<Vth(NY1); Vth(NZ0)<Vth(NY0) and
Vth(NZ1)>Vth(NY1); Vth(NZ0)>Vth(NY0)
correspond to the two different values X0=1 and X0=0 for the second forbidden transition
(RN, S)=(0, 0)→(0, 1)=>(Z, Y)=(0, 0)→(X0, not(X0)).

Possibilities to set the threshold voltage of a field effect transistor are described in the following with reference to FIG. 5.

Figure 5:
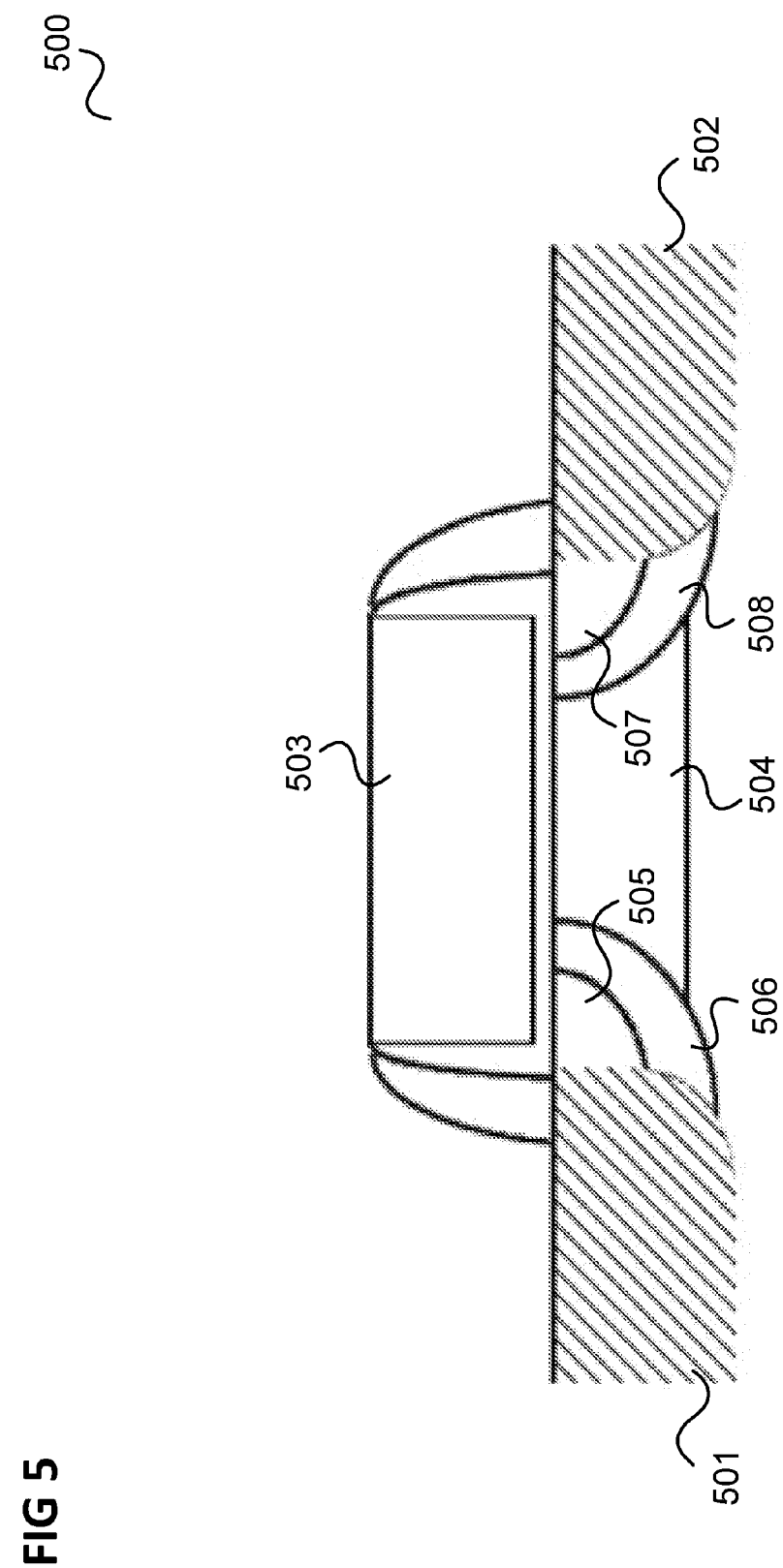
FIG. 5 shows a field effect transistor (FET).

FIG. 5 shows a field effect transistor (FET) 500.

The FET 500 includes a source region 501, a drain region 502, a gate 503 and a channel region 504. The channel region 504 may lie in a substrate or in a well within the substrate.

The source region 501 has an extension 505 and a halo 506. Similarly, the drain region 502 has an extension 507 and a halo 508.

The threshold voltage of the FET 500 can be set by setting appropriate doping concentrations in the channel region 504, of the halos 506, 508 and/or setting the doping concentration in the extensions 505, 507.

Figure 6:
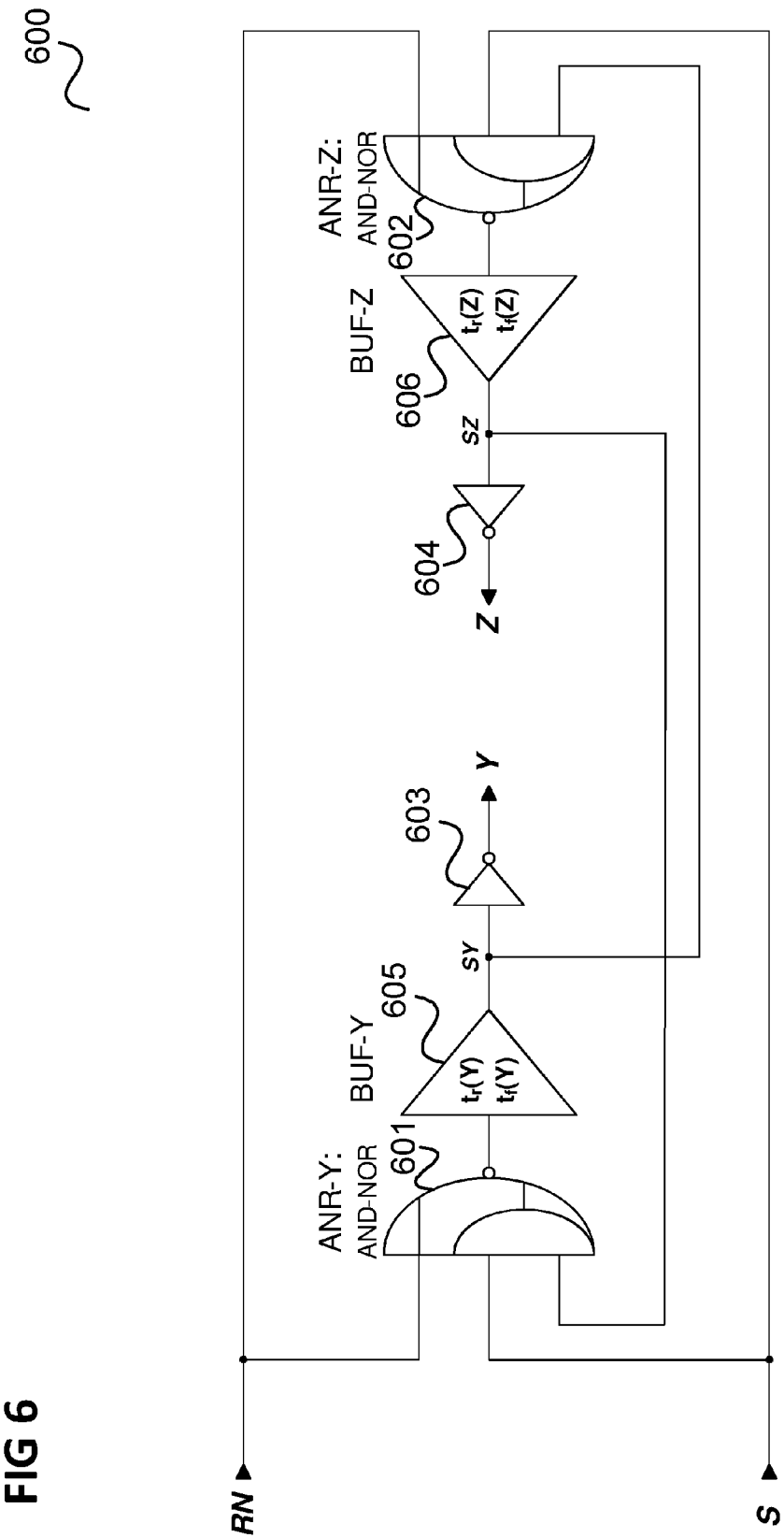
FIG. 6 shows the gate schematic of a circuit implementing an AND-NOR based magic hood cell for path-dependent Boolean Secrets.

FIG. 6 shows the gate schematic of a circuit 600 implementing an AND-NOR based magic hood cell for path-dependent Boolean Secrets.

Similarly to the circuit 300 as illustrated in FIG. 4, the circuit 600 includes a first AND-NOR 601, a second AND-NOR 602, a first inverter 603 and a second inverter 604. However, in comparison with the circuit 300, a first buffer 605 and a second buffer 606 are connected between the outputs of the AND-NOR gates 601, 602 and the first output nodes 308 (SY) and the second output node 315 (SZ), respectively, in order to increase the robustness of the magic hood cell with respect to random process variation of the relevant threshold voltages.

The buffers 605, 606 for example exhibit the same physical design but may differ with respect to their respective threshold voltage configurations of their respective (e.g. CMOS) components, resulting in different delays (and slopes) $t_r(Y)$ and $t_r(Z)$ of rising edges, and delays $t_f(Y)$ and $t_f(Z)$ of falling edges of SY and SZ, respectively. Thus, the time-asymmetry of the transitions of SY and SZ, due to the above described asymmetric Vth configurations of the AND-NOR gates ANR-Y and ANR-Z may be increased.

As for the first forbidden transition, i.e.
(RN, S)=(1, 1)→(0, 1),
the two competing pull-up paths for the outputs of the AND-NORs 601, 602, consisting in the serial connections of pMOS devices TPZ1 and TPZ0, as well as TPY1 and TPY0, are activated.

Thus, the two different threshold voltage configurations
Vth(PZ1)<Vth(PY1); Vth(PZ0)<Vth(PY0) and
Vth(PZ1)>Vth(PY1); Vth(PZ0)>Vth(PY0),
(corresponding to the two different values X1=0 and X1=1 for the first forbidden transition) may be complemented by threshold voltage configurations in the buffers 605, 606 resulting in $t_r(Z)<t_r(Y)$ and
$t_r(Z)>t_r(Y)$, respectively.

As a result, the forbidden transition
(RN, S)=(1, 1)→(0, 1)=>(Z, Y)=(1, 1)→(X1, not(X1))
is more robust against process variations than the circuit of FIGS. 3 and 4.

Figure 7:
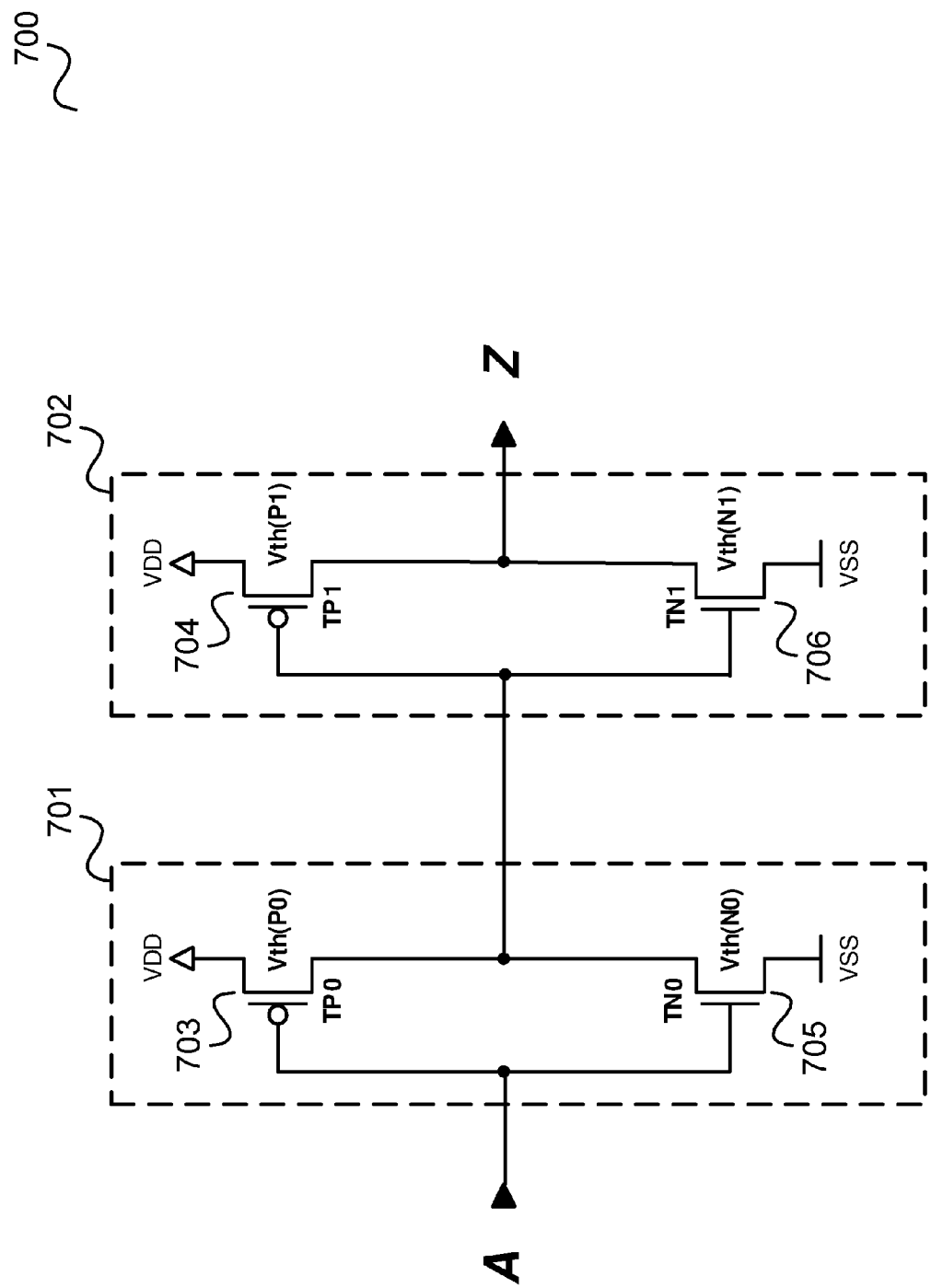
FIG. 7 shows a buffer according to an embodiment.

An example for an implementation of the buffers 605, 606 in order to illustrate the realization of the above inequalities $t_r(Z)<t_r(Y)$ and $t_r(Z)>t_r(Y)$ is given in FIG. 7.

FIG. 7 shows a buffer 700 according to an embodiment.

The buffer 700 includes a first inverter 701 and a second inverter 702, which are serially connected such that the first inverter 701 receives an input A and the second inverter 702 receives the output of the first inverter 701 and outputs an output Z of the buffer 700.

Each inverter 701, 702 is realized by a pMOS 703, 704 and an nMOS 705, 706 connected serially between the high supply potential and the low potential which receive the inverter's 701, 702 input at their gates and wherein the node between them is the output node of the inverter 701, 702.

Thus, $t_r(Z)<t_r(Y)$ may be realized by choosing in the second buffer 606 the threshold voltages of the nMOS device 705 in the first inverter 701 and of the pMOS device 704 in the second inverter 702 to be lower than the threshold voltages of the nMOS device 705 in the first inverter 701 and of the pMOS device 704 in the second inverter 702 of the first buffer 605.

On the other hand, $t_r(Z)>t_r(Y)$ may be realized by choosing in the second buffer 606 the threshold voltages of the nMOS device 705 in the first inverter 701 and of the pMOS device 704 in the second inverter 702 to be higher than the threshold voltages of the nMOS device 705 in the first inverter 701 and of the pMOS device 704 in the second inverter 702 of the first buffer 605.

As for the second forbidden transition, i.e.
(RN, S)=(0, 0)→(0, 1),
the two competing pull-down paths for the outputs of the first AND-NOR 601 and the second AND-NOR 602 including the serial connections of nMOS devices TNZ1 and TNZ0 as well as TNY1 and TNY0, are activated.

Thus, the two different threshold voltage configurations
Vth(NZ1)<Vth(NY1); Vth(NZ0)<Vth(NY0) and
Vth(NZ1)>Vth(NY1); Vth(NZ0)>Vth(NY0)
(corresponding to the two different values X0=1 and X0=0 for the second forbidden transition) may be complemented by threshold voltage configurations in buffers 605, 606 resulting in $t_f(Z)<t_f(Y)$ and
$t_f(Z)>t_f(Y)$, respectively.

As a result, the forbidden transition
(RN, S)=(0, 0)→(0, 1)=>(Z, Y)=(0, 0)→(X0, not(X0))
is more robust against process variations than the magic hood cell of FIGS. 3 and 4.

With the buffer implementation illustrated in FIG. 7, $t_f(Z)<t_f(Y)$ may be realized by choosing in the second buffer 606 the threshold voltages of the pMOS device 703 in the first inverter 701 and of the nMOS device 706 in the second inverter 702 to be lower than the threshold voltages of the pMOS device 703 in the first inverter 701 and of the nMOS device 706 in the second inverter 702 of the first buffer 605.

On the other hand, $t_f(Z)>t_f(Y)$ may be realized by choosing in the second buffer 606 the threshold voltages of the pMOS device 703 in the first inverter 701 and of the nMOS device 706 in the second inverter 702 to be higher than the threshold voltages of the pMOS device 703 in the first inverter 701 and of the nMOS device 706 in the second inverter 702 of the first buffer 605.

For the buffers 605, 606 also other options than two inverters may be used. For example, the buffers 605, 606 can also be chosen to include an inverter combined with an inverting Schmitt-Trigger circuit, whereby, with adequate Vth configurations, it is possible to increase even further the robustness margin against threshold variations caused by random process variations.

Figure 8:
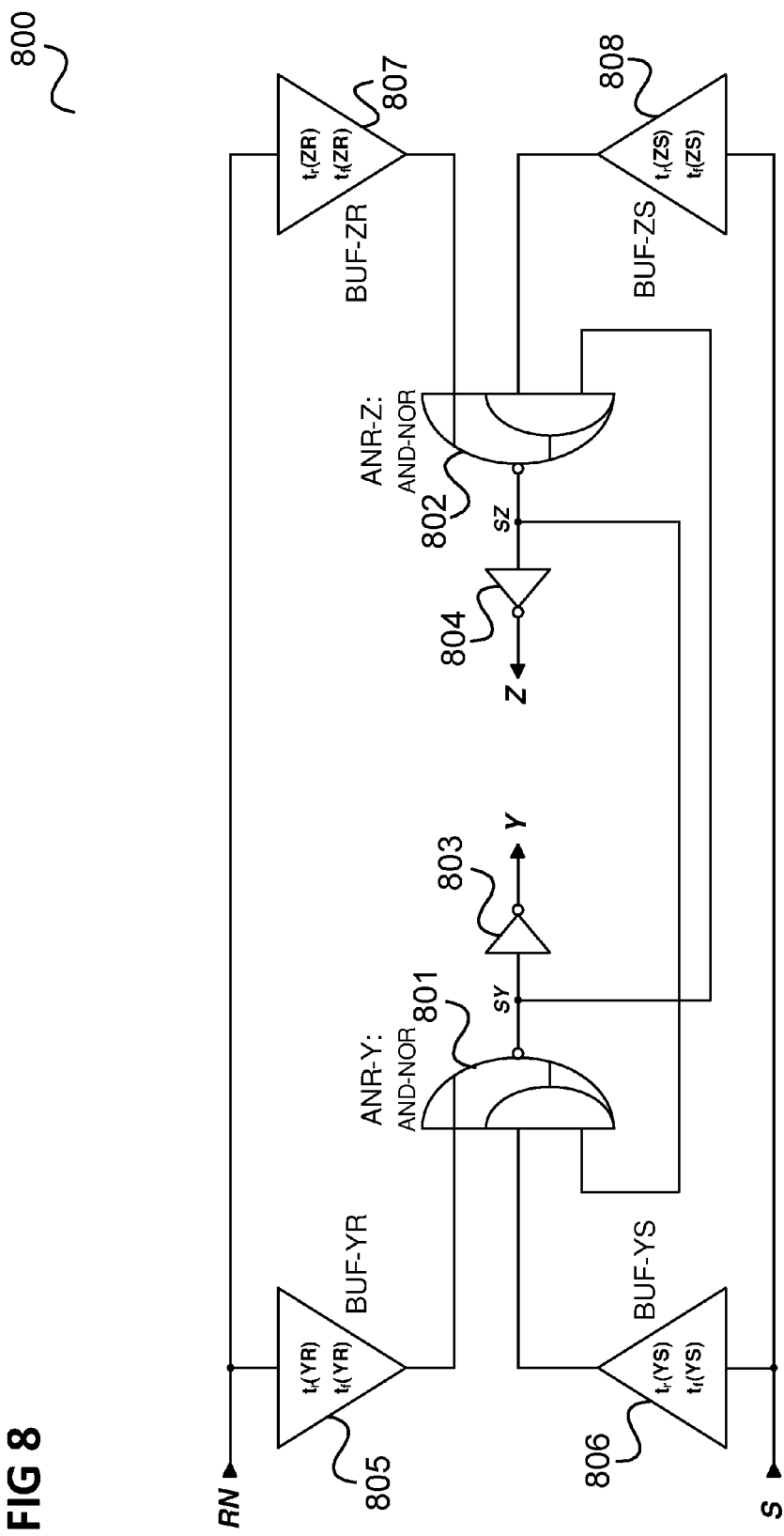
FIG. 8 shows the gate schematic of a circuit implementing an AND-NOR based magic hood cell for path-dependent Boolean secrets.

FIG. 8 shows the gate schematic of a circuit 800 implementing an AND-NOR based magic hood cell for path-dependent Boolean secrets.

Similarly to the circuit 300 as illustrated in FIG. 4, the circuit 800 includes a first AND-NOR 801, a second AND-NOR 802, a first inverter 803 and a second inverter 804.

However, in comparison with the magic hood cell of FIG. 4, four additional buffers 805, 806, 807, 808 are connected between the control inputs RN and S and the corresponding inputs of the two AND-NOR gates 801, 802 respectively, in order to increase the robustness of the magic hood cell with respect to random process variation of the relevant threshold voltages.

As for the first forbidden transition, i.e.
(RN, S)=(1, 1)→(0, 1),
the two competing pull-up paths for the outputs of the AND-NOR gates 801, 802 including the serial connections of pMOS devices TPZ1 and TPZ0, as well as TPY1 and TPY0, are activated.

Thus, the two different threshold voltage configurations
Vth(PZ1)<Vth(PY1); Vth(PZ0)<Vth(PY0) and
Vth(PZ1)>Vth(PY1); Vth(PZ0)>Vth(PY0),
(corresponding to the two different values X1=0 and X1=1 for the first forbidden transition) may be complemented by threshold voltage configurations in the first buffer 805 (having falling delay $t_f(YR)$) and the third buffer 807 (having falling delay $t_f(ZR)$) resulting in $t_f(ZR)<t_f(YR)$ and
$t_f(ZR)>t_f(YR)$, respectively.

As a result, the "forbidden transition"
(RN, S)=(1, 1)→(0, 1)=>(Z, Y)=(1, 1)→(X1, not(X1))
is more robust against process variations than magic hood cell of FIGS. 3 and 4.

With the buffer implementation illustrated in FIG. 7, $t_f(ZR)<t_f(YR)$ may be realized by choosing in the third buffer 807 the threshold voltages of the pMOS device 703 in the first inverter 701 and of the nMOS device 706 in the second inverter 702 to be lower than the threshold voltages of the pMOS device 703 in the first inverter 701 and of the nMOS device 706 in the second inverter 702 of the first buffer 805.

On the other hand, $t_f(ZR)>t_f(YR)$ may be realized by choosing in the third buffer 807 the threshold voltages of the pMOS device 703 in the first inverter 701 and of the nMOS device 706 in the second inverter 702 to be higher than the threshold voltages of the pMOS device 703 in the first inverter 701 and of the nMOS device 706 in the second inverter 702 of the first buffer 805.

As for the second forbidden transition, i.e.
(RN, S)=(0, 0)→(0, 1), the two competing pull-down paths for the outputs of the AND-NOR gates 801, 802 including the serial connections of nMOS devices TNZ1 and TNZ0 as well as TNY1 and TNY0, are activated.

Thus, the two different threshold voltage configurations
Vth(NZ1)<Vth(NY1); Vth(NZ0)<Vth(NY0) and
Vth(NZ1)>Vth(NY1); Vth(NZ0)>Vth(NY0)
(corresponding to the two different values X0=1 and X0=0 for the second forbidden transition) may be complemented by threshold voltage configurations in the fourth buffer 808 (having rising delay $t_r(ZS)$) and the second buffer 806 (having rising delay $t_r(YS)$) resulting in $t_r(ZS)<t_r(YS)$ and
$t_r(ZS)>t_r(YS)$, respectively.

As a result, the "forbidden transition"
(RN, S)=(0, 0)→(0, 1)=>(Z, Y)=(0, 0)→(X0, not(X0))
is more robust against process variations than the magic hood cell of FIGS. 3 and 4.

With the buffer implementation illustrated in FIG. 7, $t_r(ZS)<t_r(YS)$ may be realized by choosing in the fourth buffer 808 the threshold voltages of the nMOS device 705 in the first inverter 701 and of the pMOS device 704 in the second inverter 702 to be lower than the threshold voltages of the nMOS device 705 in the first inverter 701 and of the pMOS device 704 in the second inverter 702 of the second buffer 806.

On the other hand, $t_r(ZS)>t_r(YS)$ may be realized by choosing in the fourth buffer 808 the threshold voltages of the nMOS device 705 in the first inverter 701 and of the pMOS device 704 in the second inverter 702 to be higher than the threshold voltages of the nMOS device 705 in the first inverter 701 and of the pMOS device 704 in the second inverter 702 of the second buffer 806.

It should be noted that in order to save transistor count, instead of the buffers 805, 806, 807, 808 also inverters may be used between the input control signals and the corresponding inputs of the AND-NOR gates 801, 802. For this, the low-active RN can be replaced by a high-active R and the high-active S can be replaced by a low-active SN.

Figure 9:
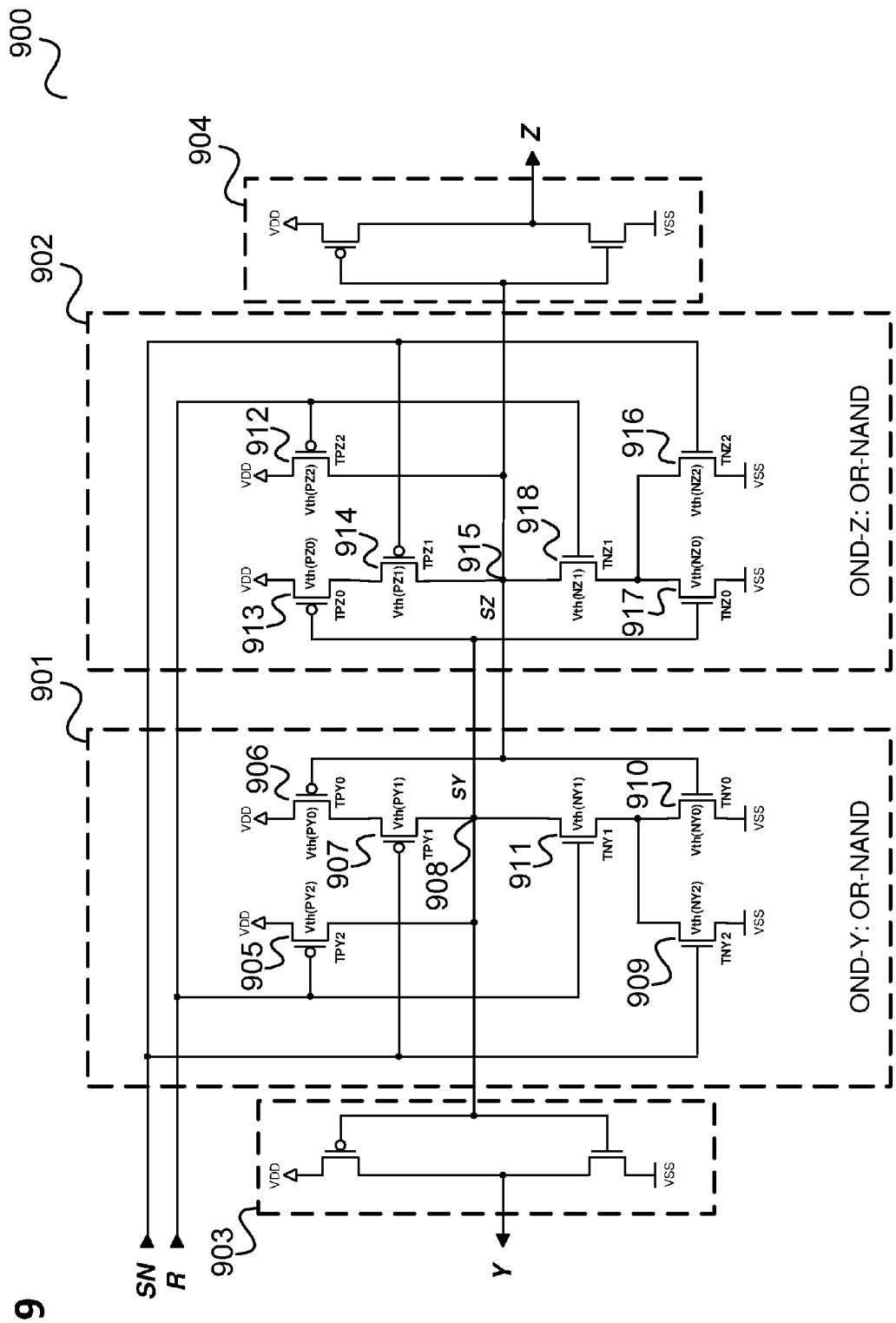
FIG. 9 shows a circuit implementing a magic hood cell for path dependent Boolean secrets that is OR-NAND based.

FIG. 9 shows a circuit 900 implementing a magic hood cell for path dependent Boolean secrets that is OR-NAND based.

The circuit 900 has two control inputs SN and R and two outputs Z and Y. The circuit includes a first OR-NAND 901, a second OR-NAND 902, a first inverter 903 and a second inverter 904.

The first OR-NAND 901 includes a first p channel FET 905 whose source is connected to the high supply potential (VDD) and whose gate is supplied with the signal R and whose drain is connected to a first output node (or feedback node) 908 whose state is referred to by SY. The first OR-NAND 901 further includes a second p channel FET 906 whose source is connected to the high supply potential (VDD) and whose drain is connected to the source of a third p channel FET 907 whose gate is supplied with the signal SN and whose drain is connected to the first output node 908.

The first OR-NAND 901 further includes a first n channel FET 909 whose source is connected to the low supply potential (VSS) and whose gate is supplied with the signal SN. The first OR-NAND 901 further includes a second n channel FET 910 whose source is connected to the low supply potential (VSS). The drains of the first n channel FET 909 and the second n channel FET 910 are connected to the source of a third n channel FET 911 whose gate is supplied with the signal R and whose drain is connected to the first output node 908.

The second OR-NAND 902 includes a fourth p channel FET 912 whose source is connected to the high supply potential (VDD) and whose gate is supplied with the signal R and whose drain is connected to a second output node (or feedback node) 915 whose state is referred to by SZ. The second OR-NAND 902 further includes a fifth p channel FET 913 whose source is connected to the high supply potential (VDD) and whose drain is connected to the source of a sixth p channel FET 914 whose gate is supplied with the signal SN and whose drain is connected to the second output node 915.

The second OR-NAND 902 further includes a fourth n channel FET 916 whose source is connected to the low supply potential (VS S) and whose gate is supplied with the signal SN. The first second OR-NAND 902 further includes a fifth n channel FET 917 whose source is connected to the low supply potential (VSS). The drains of the fourth n channel FET 916 and the fifth n channel FET 910 are connected to the source of a sixth n channel FET 918 whose gate is supplied with the signal R and whose drain is connected to the second output node 915.

The first output node 908 is further connected to the input of the first inverter 903 whose output is the output Y. Further, the first output node 908 is connected to the gates of the fifth p channel FET 913 and the fifth n channel FET 917.

The second output node 915 is further connected to the input of the second inverter 904 whose output is the output Z. Further, the second output node 915 is connected to the gates of the second p channel FET 906 and the second n channel FET 910.

The inverters 903, 904 are for example realized by a p channel FET and an n channel FET connected serially between the high supply potential and the low potential which receive the inverter's 903, 904 input at their gates and wherein the node between them is the output node of the inverter 903, 904.

For R=0 the circuit is in its first precharge state:
R=0=>(SZ, SY)=(1, 1)=>(Z, Y)=(0, 0).

For (R, SN)=(1, 1) the circuit is in its second precharge state:
(R, SN)=(1, 1)=>(SZ, SY)=(0, 0)=>(Z, Y)=(1, 1).

The first forbidden transition is given by
(R, SN)=(0, 0)→(1, 0),
whereby the two competing pull-down paths, including the serial connections of the fifth n channel FET 917, denoted by TNZ0, and the sixth n channel FET 918, denoted by TNZ1, for SZ, as well as the second n channel FET 910, denoted by TNY0, and the third n channel FET 911, denoted by TNY1 for SY, are activated.

Thus, the two different threshold voltage configurations
Vth(NZ1)<Vth(NY1); Vth(NZ0)<Vth(NY0) and
Vth(NZ1)>Vth(NY1); Vth(NZ0)>Vth(NY0)
correspond to the two different values X0=1 and X0=0 for the first forbidden transition
(R, SN)=(0, 0)→(1, 0)=>(Z, Y)=(0, 0)→(X0, not(X0)).

The second forbidden transition is given by
(R, SN)=(1, 1)→(1, 0),
whereby the two competing pull-up paths including the serial connections of the fifth p channel FET 913, denoted by TPZ0 (having threshold voltage Vth(PZ0)), and the sixth p channel FET 914, denoted by TPZ1 (having threshold voltage Vth(PZ1)), for SZ, as well as the second p channel FET 906, denoted by TPY0 (having threshold voltage Vth(PY0)), and the third p channel FET 907, denoted by TPY1 (having threshold voltage Vth(PY1)), for SY, are activated.

Thus, the two different threshold voltage configurations
Vth(PZ1)<Vth(PY1); Vth(PZ0)<Vth(PY0) and Vth(PZ1)>Vth(PY1); Vth(PZ0)>Vth(PY0)
correspond to the two different values X1=0 and X1=1 for the second forbidden transition (R, SN)=(1, 1)→(1, 0)=>(Z, Y)=(1, 1)→(X1, not(X1)).

Figure 10:
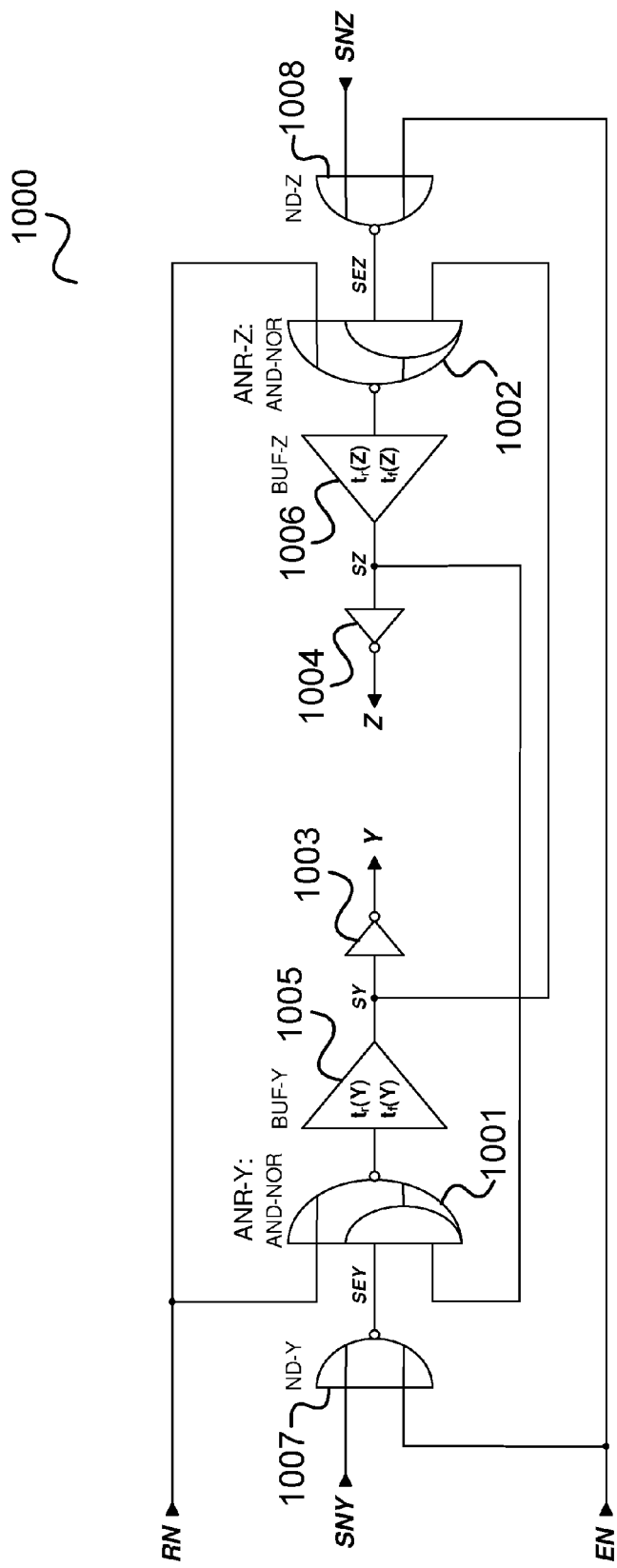
FIG. 10 shows a circuit implementing an AND-NOR based RSX Flip-Flop.

FIG. 10 shows a circuit 1000 implementing an AND-NOR based RSX Flip-Flop, i.e. an magic hood cell as described with reference to figures with FIGS. 3 to 6 featuring the additional function of a regular RS-FF.

Similarly to the circuit 600, the circuit 1000 includes a first AND-NOR 1001, a second AND-NOR 1002, a first inverter 1003, a second inverter 1004, a first buffer 1005 and a second buffer 1006.

In addition, the S input of the first AND-NOR 1001 is preceded by a first NOR 1007 which has an input signal SNY and an enable signal EN as inputs. Similarly, the S input of the second AND-NOR 1002 is preceded by a second NOR 1008 which has an input signal SNZ and the enable signal EN as inputs.

The input control signal transition
(RN, SNZ, SNY, EN)=(0, 0, 1, 1)→(0, 0, 1, 0)
causes the output signal transition
(Z, Y)=(0, 0)→(1, 0),
i.e. the SET function of a regular RS-FF.
The input control signal transition
(RN, SNZ, SNY, EN)=(0, 1, 0, 1)→(0, 1, 0, 0)
causes the output signal transition
(Z, Y)=(0, 0)→(0, 1),
i.e. the RESET function of a regular RS-FF.
Besides, the first forbidden MH transition
(RN, SNZ, SNY, EN)=(1, 0, 0, 0)→(0, 0, 0, 0)
results in
(Z, Y)=(1, 1)→(X1, not(X1)),
whereas the second forbidden MH transition
(RN, SNZ, SNY, EN)=(0, 0, 0, 1)→(0, 0, 0, 0)
results in
(Z, Y)=(0, 0)→(X0, not(X0)),
as described above with reference to FIGS. 3 to 6.

Figure 11:
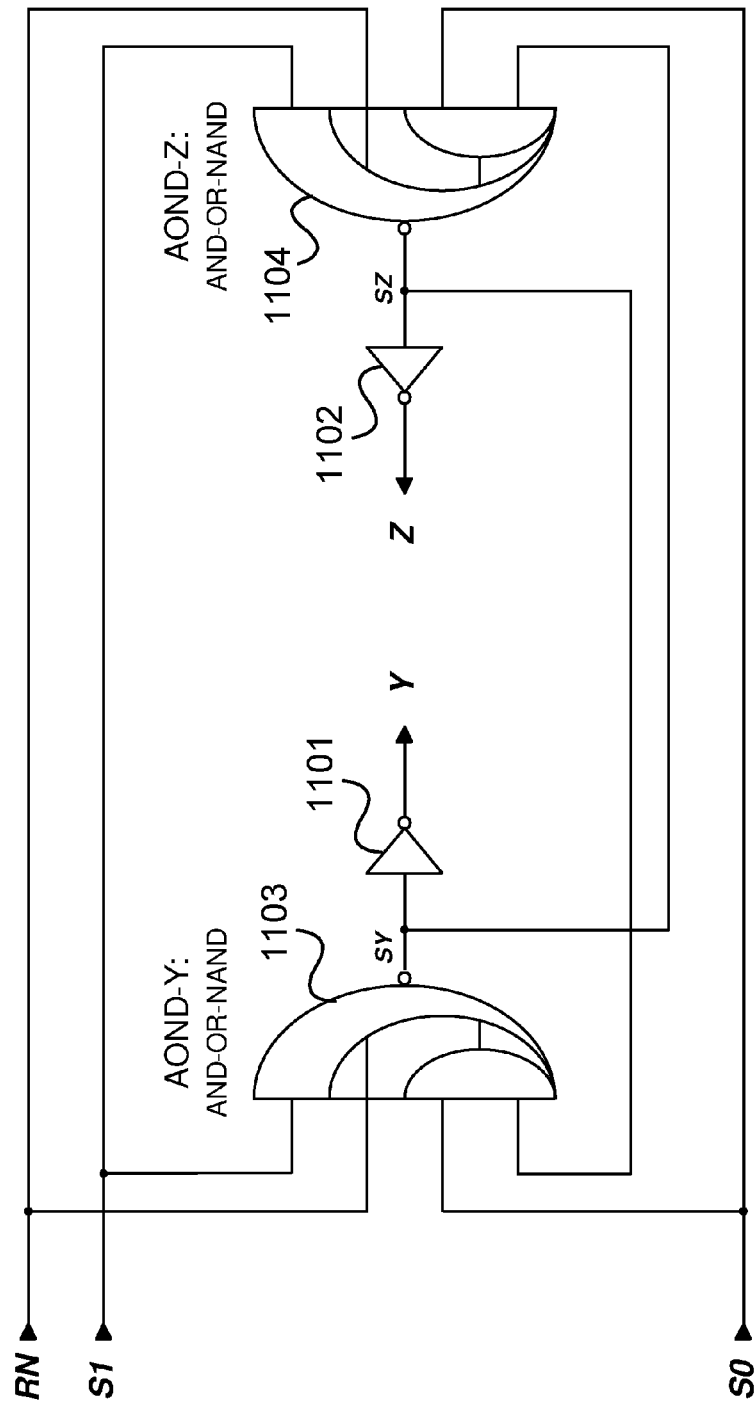
FIG. 11 shows a circuit implementing an AND-OR-NAND based magic hood cell.

FIG. 11 shows a circuit 1100 implementing an AND-OR-NAND based magic hood cell. This can be seen as a generalization of the MH cell described with reference to FIGS. 3 to 6.

The circuit 1100 has outputs Y and Z generated by a first inverter 1101 and a second inverter 1102 from the states SY and SZ of two output (or feedback) nodes and has the input signals RN, S1 and S0.

The circuit 1100 includes a first AND-OR-NAND 1103 which receives the state SZ and the signal S0 at its AND inputs, the signal RN at its OR input and the signal S1 at its NAND input and outputs SY.

Similarly, the circuit 1100 includes a second AND-OR-NAND 1104 which receives the state SY and the signal S0 at its AND inputs, the signal RN at its OR input and the signal S1 at its NAND input and outputs SZ.

Thus, there are three control inputs RN, S1 and S0 and three precharge states
S1=0=>(Z, Y)=(0, 0),
(S1, RN)=(1, 1)=>(Z, Y)=(1, 1) and
(S1, RN, S0)=(1, 0, 0)=>(Z, Y)=(0, 0),
as well as three forbidden transitions:
(S1, RN, S0)=(0, 0, 1)→(1, 0, 1), resulting in (Z, Y)=(0, 0)→(X0, not(X0)),
(S1, RN, S0)=(1, 1, 1)→(1, 0, 1), resulting in (Z, Y)=(1, 1)→(X1, not(X1))
and
(S1, RN, S0)=(1, 0, 0)→(1, 0, 1), resulting in (Z, Y)=(0, 0)→(X0, not(X0)).

It should be noted that there are only two independent secrets X0 and X1, since there are also only two competing pull-up and pull-down paths within the two AND-OR-NAND gates 1103, 1104.

Figure 12:
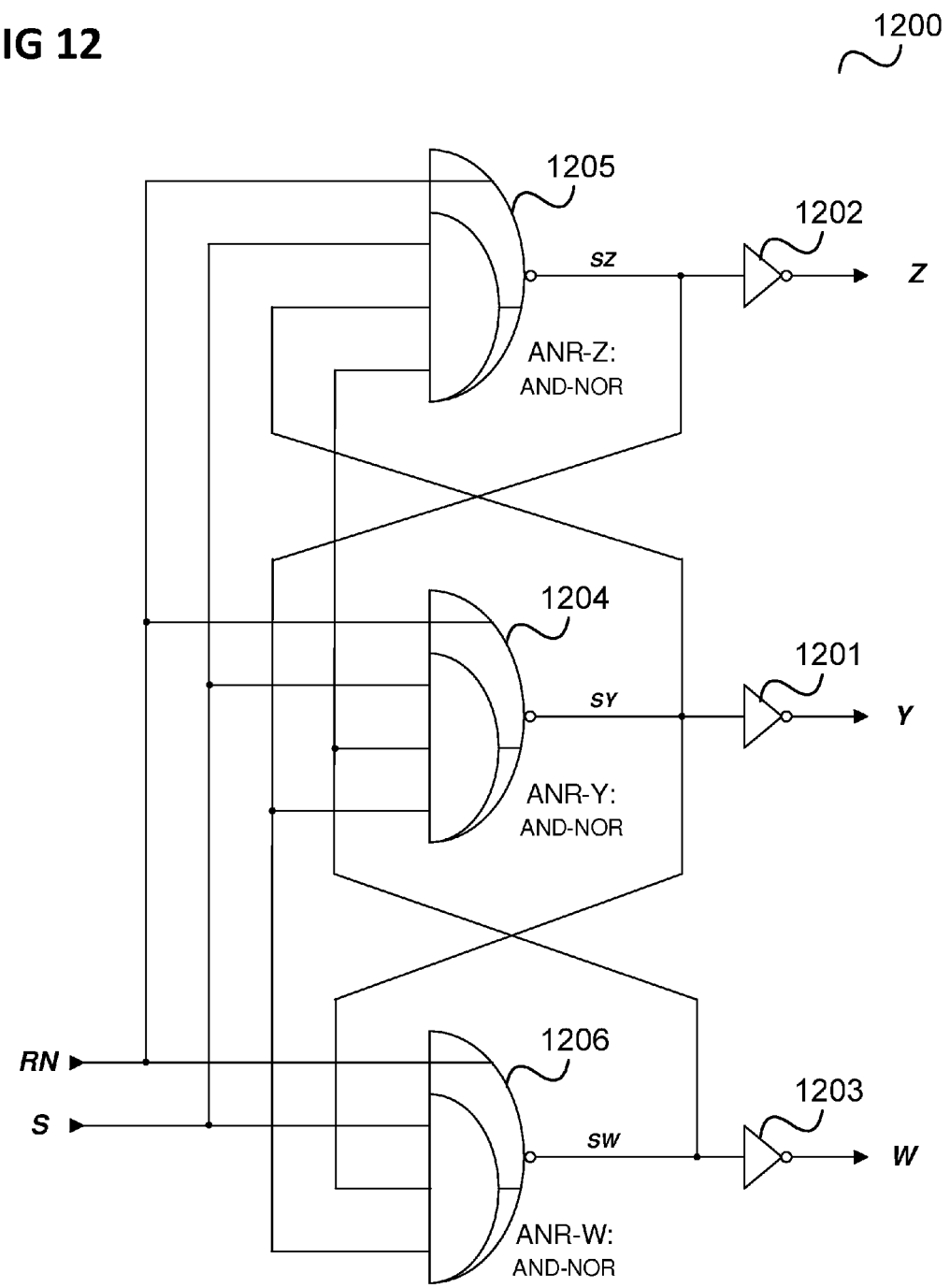
FIG. 12 shows a circuit implementing an AND-NOR based magic hood cell having multiple feedback.

FIG. 12 shows a circuit 1200 implementing an AND-NOR based magic hood cell having multiple feedback, which can be seen as another example for generalizations of the magic hood cell of FIGS. 3 to 6.

The circuit 1200 has outputs Y, Z and W generated by a first inverter 1201, a second inverter 1202 and a third inverter 1203 from the states SY, SZ and SW of three output (or feedback) nodes and has the input signals RN and S.

The circuit 1200 includes a first AND-NOR 1204 which receives the states SZ, SW and the signal S at its AND inputs and the signal RN at its NOR input and outputs SY.

Similarly, the circuit 1200 includes a second AND-NOR 1205 which receives the states SY, SW and the signal S at its AND inputs and the signal RN at its NOR input and outputs SZ.

Similarly, the circuit 1200 includes a third AND-NOR 1206 which receives the states SY, SZ and the signal S at its AND inputs and the signal RN at its NOR input and outputs SW.

Depending on the control inputs RN and S there are the two precharge states
RN=1=>(Z, Y, W)=(1, 1, 1) and
(RN, S)=(0, 0)=>(Z, Y, W)=(0, 0, 0)
of the three outputs Z, Y and W.
For (RN, S)=(0, 1) there are three stable states of the outputs:
(RN, S)=(0, 1)=>
either (Z, Y, W)=(1, 0, 0), or (Z, Y, W)=(0, 1, 0) or (Z, Y, W)=(0, 0, 1).

All three output states can be arrived at from one of the two precharge states, either in case of the transition (RN, S)=(1, 1)→(0, 1), by activating simultaneously all the AND-NOR gates' pull-up paths, or in case of the transition
(RN, S)=(0, 0)→(0, 1)
by activating simultaneously all the AND-NOR gates' pull-down paths. Thus, by suitably and independently choosing the Vth configurations for the pull-up and pull-down paths, respectively, nine different incarnations of this MH circuit can be realized, all of them with identical physical design, but pairwise differing from each other in their forbidden transition behavior.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A method for manufacturing a digital circuit comprising:
forming a plurality of field effect transistor pairs;
connecting the field effect transistors of the field effect transistor pairs such that in response to a first transition from a first state of two nodes of the digital circuit and in response to a second transition from a second state of the nodes of the digital circuit the nodes each have an undefined logic state when, for each field effect transistor pair, the threshold voltages of the field effect transistors of the field effect transistor pair are equal;
setting the threshold voltages of the field effect transistors of the field effect transistor pairs such that the nodes each have a predetermined defined logic state in response to the first transition and in response to the second transition;

forming one or more pairs of competing paths such that, for each field effect transistor pair, the two field effect transistors are in different competing paths of a pair of competing paths; and connecting the one or more pairs of competing paths and the nodes such that for each pair of competing paths, the competing paths are connected to different ones of the two nodes and the electrical state of the node connected to one of the competing paths is fed back to the other of the competing paths to hinder it in a competition of the competing paths.

2. The method of claim 1, wherein the plurality of field effect transistor pairs comprises one or more pull-up field effect transistor pairs each having a field effect transistor in a first pull-up path and a field effect transistor in a second pull-up path and comprising connecting the first pull-up path to one of the two nodes and the second pull-up path to the other of the two nodes.

3. The method of claim 2, comprising setting, for each pull-up field effect transistor pair, the threshold voltage of the field effect transistor in the first pull-up path to be lower than the threshold voltage of the field effect transistor in the second pull-up path.

4. The method of claim 1, wherein the plurality of field effect transistor pairs comprises one or more pull-down field effect transistor pairs each having a field effect transistor in a first pull-down path and a field effect transistor in a second pull-down path and comprising connecting the first pull-down path to one of the two nodes and the second pull-down path to the other of the two nodes.

5. The method of claim 4, comprising setting, for each pull-down field effect transistor pair, the threshold voltage of the field effect transistor in the first pull-down path to be lower than the threshold voltage of the field effect transistor in the second pull-down path.

6. The method of claim 1, comprising forming outputs for signals representing the logic states of the nodes.

7. The method according to claim 6, comprising forming a further circuit component and a connection for supplying the signal to the further circuit component.

8. The method according to claim 7, wherein the further circuit component is a logic gate.

9. The method according to claim 7, wherein the further circuit component is a flip-flop.

10. The method according to claim 1, wherein, for each field effect transistor pair, the two field effect transistors of the field effect transistor pair are both n channel field effect transistors or the two field effect transistors of the field effect transistor pair are both p channel field effect transistors.

11. The method according to claim 1, wherein the field effect transistors of the field effect transistor pairs are MOSFETs.

12. The method according to claim 1, comprising forming one or more pairs of competing paths such that, for each field effect transistor pair, the two field effect transistors are in different competing paths of a pair of competing paths.

13. The method according to claim 12, comprising connecting the one or more pairs of competing paths such that the logic states of the nodes depend on the result of the competition between the competing paths of the one or more pairs of competing paths.

14. The method of claim 1, comprising connecting the field effect transistors of the field effect transistor pairs to pull-up paths and pull-down paths connected to the two nodes and setting the threshold voltages of the field effect transistors of the pull-up paths independently from the threshold voltages of the field effect transistors of the pull-down paths.

15. The method according to claim 1, comprising forming the plurality of field effect transistors in CMOS technology.

16. The method according to claim 1, wherein, for each of the nodes, the predetermined defined logic state is a logic 0 or a logic 1.

17. The method according to claim 1, wherein, for each field effect transistor pair, the field effect transistors of the field effect transistor pair are formed to substantially have the same dimensions.

18. The method according to claim 1, comprising forming the digital circuit such that the first transition and the second transition occur in response to a predetermined input, comprising one or more input signals supplied to field effect transistors of the field effect transistor pairs.

19. The method of claim 1, wherein the first transition is a pulling up of the nodes and the method comprises connecting the nodes such that, when one of the nodes has been pulled up, it prevents the other node from being pulled up.

20. The method of claim 1, wherein the second transition is a pulling down of the nodes and the method comprises connecting the nodes such that, when one of the nodes has been pulled down, it prevents the other node from being pulled down.

* * * * *